United States Patent
Assadi et al.

(10) Patent No.: US 6,665,014 B1
(45) Date of Patent: *Dec. 16, 2003

(54) MICROLENS AND PHOTODETECTOR

(75) Inventors: Azar Assadi, Tempe, AZ (US); Kannan Raj, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/200,239

(22) Filed: Nov. 25, 1998

(51) Int. Cl.$^7$ .................. H04N 5/225; H04N 5/222; H01L 31/0232; G02B 27/10
(52) U.S. Cl. ............... 348/340; 348/333.05; 257/432; 359/622
(58) Field of Search .................. 348/335, 339, 348/340, 342, 360, 333.08; 250/214.1, 216, 241.1, 208.1; 257/432; 359/622

(56) References Cited

U.S. PATENT DOCUMENTS

| | | | | | |
|---|---|---|---|---|---|
| 4,667,092 A | * | 5/1987 | Ishihara | ............... | 250/208.1 |
| 5,258,024 A | * | 11/1993 | Chavel et al. | ............... | 351/159 |
| 5,321,297 A | * | 6/1994 | Enomoto | ............... | 257/432 |
| 5,323,052 A | * | 6/1994 | Koyama | ............... | 250/208.1 |
| 5,371,397 A | * | 12/1994 | Maegawa et al. | ............... | 257/229 |
| 5,514,888 A | * | 5/1996 | Sano et al. | ............... | 257/232 |
| 5,517,279 A | * | 5/1996 | Hugle et al. | ............... | 355/46 |
| 5,610,390 A | * | 3/1997 | Miyano | ............... | 250/208.1 |
| 5,614,950 A | * | 3/1997 | Park et al. | ............... | 257/232 |
| 5,648,874 A | * | 7/1997 | Sawaki et al. | ............... | 359/619 |
| 5,672,519 A | * | 9/1997 | Song et al. | ............... | 216/26 |
| 5,677,200 A | * | 10/1997 | Park et al. | ............... | 257/432 |
| 5,682,203 A | * | 10/1997 | Kato | ............... | 348/340 |
| 5,734,190 A | | 3/1998 | Hawkins et al. | ............... | 257/432 |
| 5,746,797 A | * | 5/1998 | Noda | ............... | 65/17.2 |
| 5,768,023 A | * | 6/1998 | Sawaki et al. | ............... | 359/622 |
| 5,811,320 A | | 9/1998 | Rostoker | ............... | 438/48 |
| 5,871,888 A | * | 2/1999 | Heremans et al. | ............... | 430/321 |
| 6,150,653 A | * | 11/2000 | Assadi et al. | ............... | 250/216 |
| 6,194,704 B1 | * | 2/2001 | Assadi et al. | ............... | 250/214 R |

OTHER PUBLICATIONS

D.R. Uhlmann, et al., "Sol–gel derived coatings on glass", Journal of Non–Crystalline Solids (1997); pp. 113–119.

C.-Y. Li, et al., "Sol–gel integrated optical coupler by ultraviolet light imprinting".

Mark P. Andrews, "An Overview of Sol–gel Guest–Host Materials Chemistry for Optical Devices", SPIE vol. 2997; pp. 48–59.

\* cited by examiner

Primary Examiner—Wendy R. Garber
Assistant Examiner—James Hannett
(74) Attorney, Agent, or Firm—Trop, Pruner & Hu, P.C.

(57) ABSTRACT

An array of photosensitive devices may be formed with improved fill factors by including a diffractive microlens which may have a stepped configuration. The microlens may be formed of a sol–gel material having a photoinitiator, or other materials that may be defined with low temperature techniques commonly used in connection with photoresist. In particular, a gray scale mask may be used to define a plurality of steps in the resulting microlens which have different diffractive characteristics.

16 Claims, 2 Drawing Sheets

MICROLENS AND PHOTODETECTOR

BACKGROUND

This invention relates generally to microlenses and to photodetectors which may be used, for example, for digital imaging devices including cameras and scanners.

Photodetectors are used to detect light in a digital imaging device. A large number of photodetectors may each detect a light intensity value for a given pixel. These light intensity values are digitized and used to form a digital depiction of a particular image. Such imaging devices are used in digital cameras, scanners and other devices.

The imaging device may be formed, for example, using complementary metal oxide semiconductor (CMOS) technology. Imaging devices made using CMOS technology include active pixel sensors (APS) and passive pixel sensors (PPS). Alternatively, the imaging device may use charge coupled device (CCD) technology. All of these devices can be made of particularly small size.

Imaging arrays of particularly small size may have a fill factor problem. The fill factor is the amount of light that falls on any given photodetector. Ideally, the amount of light that falls on each photodetector is designed to be as high as possible to improve the signal to noise ratio. In order to improve the fill factor with small photodetectors, a microlens may be situated over the photodetector. The microlens focuses all the light incident on a pixel onto the photodetector and therefore improves the fill factor of the photodetector.

However, with conventional microlenses, formation of these relatively small microlenses with high precision and tolerance may be difficult. For example, the devices may require elaborate temperature or etching conditions which make their fabrication time consuming and expensive. In addition, the optical clarity of some microlenses adversely affects the incoming light.

Therefore, it would be desirable to have a microlens with improved characteristics.

SUMMARY

In accordance with one embodiment, a photodetector includes diffractive lens elements. A photosensitive device is arranged to receive the light through the lens elements.

DETAILED DESCRIPTION

Figure 2:
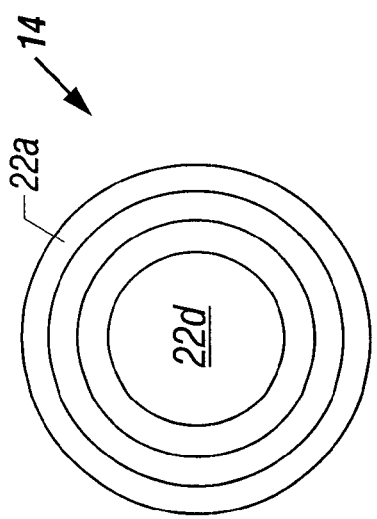
FIG. 2 is a top plan view taken generally along the line 2—2 in FIG. 1.

A photosensitive array 10 may include a plurality of photodetectors 12 which convert an input light signal into an analog signal carrying information about the intensity of the light incident on the photodetectors. The signals from a plurality of photodetectors can be digitized and combined to prepare a digital recreation of the exposed image. This digital representation may then be used in digital cameras and scanners and other imaging devices to reproduce a representation of the exposed scene.

Centered on top of each photodetector 12 is a microlenses 14. Elements 14b and 14a of adjacent microlenses serve to diffract light so that more light falls on the exposed, underlying photodetector 12.

A color filter array (CFA) 16 and a silicon oxide layer 18 may be formed between the photodetector 12 and the microlens 14. Metal vias 20 may extend upwardly beneath the microlens 14 through the silicon dioxide layer 18.

Figure 1:
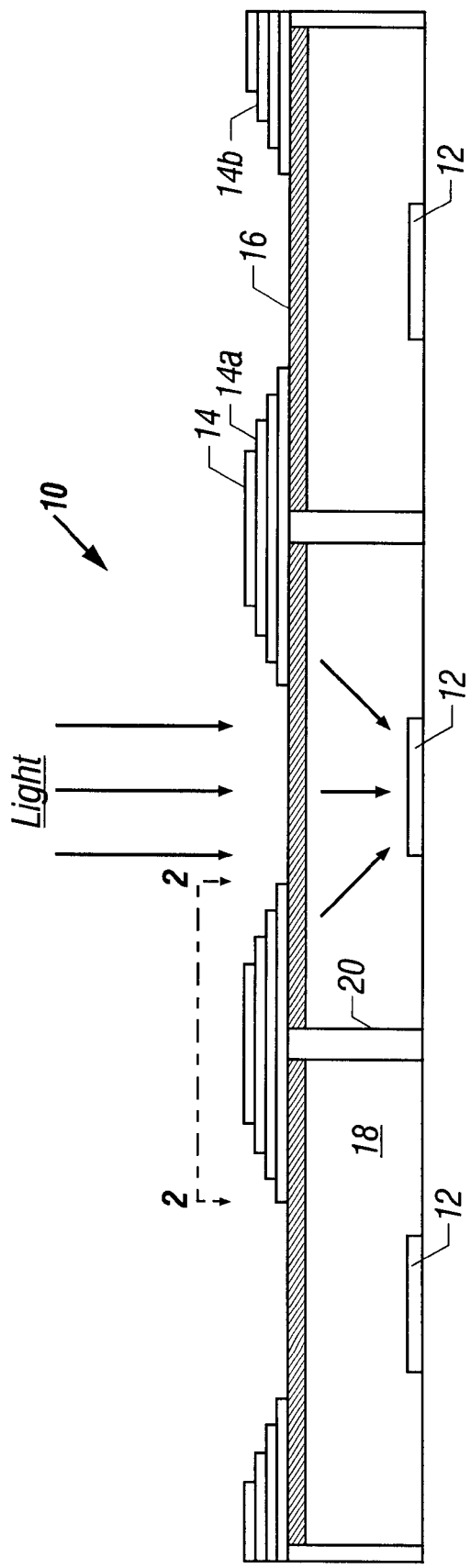
FIG. 1 is an enlarged cross-sectional view taken vertically through a photodetector in accordance with one embodiment of the present invention.

Referring to FIG. 2, the microlens 14 may be symmetrical and circular in shape viewed from above and may have an overall pyramidal configuration. The microlens may be formed of a plurality of steps 22 which create a stepped configuration when viewed from the side, as illustrated in FIG. 1.

While four steps are shown in the illustrated embodiment, the number of steps is subject to considerable variability and would depend on the design of a particular photosensitive array.

The effect of the microlens 14 is to receive and diffract incident light, thereby collecting additional light which may be focused on the photodetector 12. This improves the effective fill-factor of the photodetectors 12 improving the light collection efficiency of the pixel and the array 10.

One advantageous material for forming the microlens 14 is a sol-gel hybrid glass. Advantageous sol-gel hybrid glasses for use in the present invention may be formed using low temperature formation processes. Thus, the glasses may be shaped and formed using techniques comparable to those utilized in connection with forming photoresists. That is, UV light may be used to expose a portion of the sol-gel material and to develop that material so that the remaining portion may be removed. Also, the sol-gel may exhibit advantageous transmissivities compared to conventional materials used to form microlenses.

Sol-gel glasses may be formed, for example, by hydrolysis of tetraethylorthosilicate (TEOS) and/or tetramethylorthosilicate (TMOS). After hydrolysis, these materials may be subjected to oxolation or oxygen bridge formation and polycondensation. The result is a silicon oxide complex which is solvent swollen to form a polymerized network. If a photoinitiator is included in the complex, the material may be shaped using conventional photoresist patterning techniques.

In accordance with one embodiment, a sol-gel hybrid glass can be prepared by hydrolysis polycondensation of the methacrylate group substituted silane in the presence of water. The gel synthesis happens, allowing the methylacryloxypropyl trimethoxysilane or glysidoxypropyltrimethylsilane precursor material to react with diluted acid or base water solution, for example, in a molar ratio of 1:2 respectively for several hours.

Before spin coating, propriety amounts of 1-hydroxycyclohexyl phenyl ketone may be added as a photoinitiator to initiate polymerization of unsaturated glass hybrid polymer.

The gel may be filtered by an 0.1 millimeter filter to remove aggregated polymer particles and to form a film with good surface quality. Films may then be then deposited on top of previously fabricated color filter polymer used to form the CFA or on other substrates and pre-baked at 60° C. for 15 minutes. The resulting film thickness is adjustable by varying spinning speed and use of solvents such as methanol, ethanol or xylene.

Figure 3:
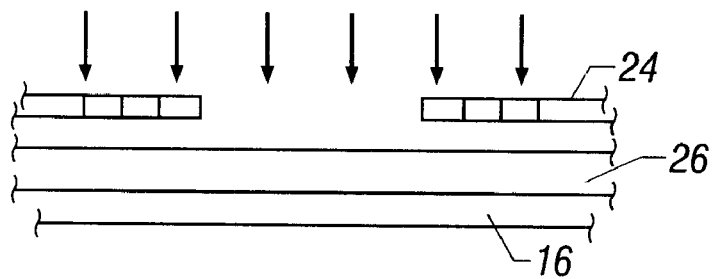
FIG. 3 shows the UV light exposure step used in one method of forming the device as shown in FIG. 1.
Figure 4:
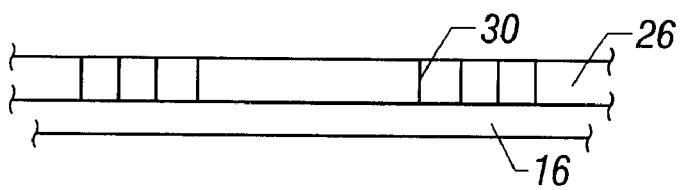
FIG. 4 shows the result of the UV light exposure step illustrated in FIG. 3.
Figure 5:
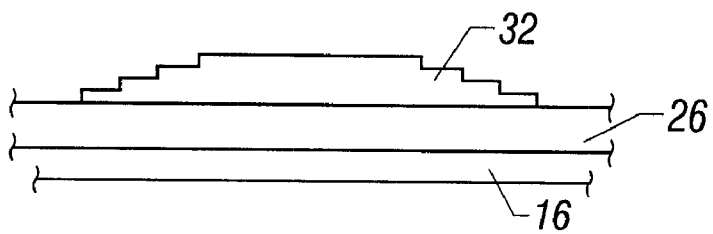
FIG. 5 shows the structure that results from developing the structure shown in FIG. 4.

The spin coated films may be cured by a mercury UV lamp or other light source through an opening in a photomask, for example, for 1 to 30 minutes to form patterns, as shown in FIG. 3. In particular, a UV mask 24 may be situated over the hybrid sol-gel 26 located over the CFA 16 to create a graded exposure pattern in the sol-gel 26 as indicated by lines 30 in FIG. 4. The patterned structures 28 may be obtained by developing the sol-gel 26 in isopropanol to remove unexposed parts of the sol-gel to form the steps 32, as shown in FIG. 5. After this removal step, the film may be postbaked at 100 to 200° C. for 10 to 60 minutes to harden the film.

The sol-gel 26 may be formed of a plurality of discrete layers having distinct optical properties. Each layer or combination of layers may form a different step 22, as indicated in FIG. 5.

If particular material properties are necessary, titanium, silicon or zirconium, or the prehydrolysed alkoksides of these materials can be added to the solution of the methacrylate group substituted silanes. For example, titanium (IV)-propoxide and zirconium(IV)-propoxide may be used. Methacrylic acid may be used to prevent zirconium propoxide precipitation.

To produce the microlens shape shown in FIG. 2, a gray scale mask may be used. See Suleski, T. J. and Oshea, D. C.1995, "Gray Scale Mask For Diffractive Optics Fabrication," Appl. Optics 34, 7507. A conventional mask material, which may be quartz or glass, is coated conventionally with chromium.

In this way the sol-gel may be deposited and patterned at a temperature of less than 200° C. This avoids adversely affecting the CFA.

Figure 6:
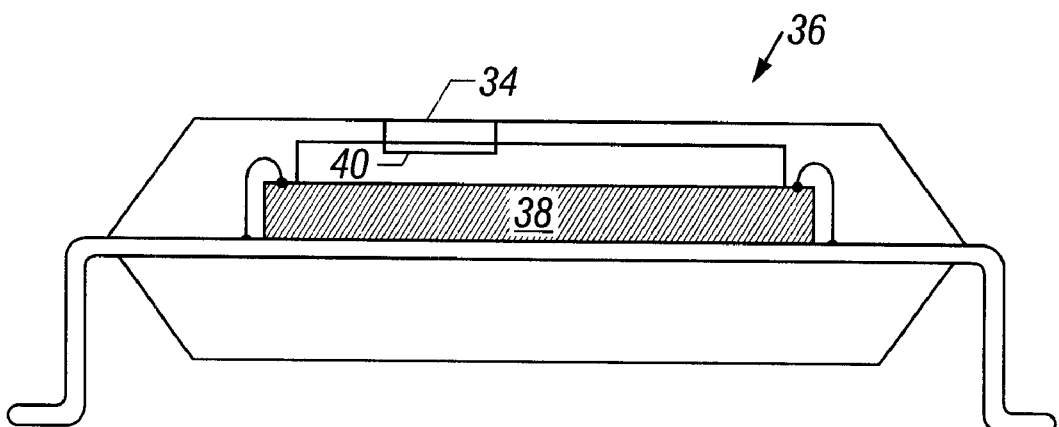
FIG. 6 is an enlarged cross-sectional view of a package for a integrated circuit package in accordance with one embodiment of the present invention.

The same sol-gel material may also be patterned at low temperatures using a photoinitiator to form anti-reflective coatings, coloration, selective reflectors, electrochromism and photochromism selective absorption. For example, a window 34 may be formed in the package 36 of an integrated circuit imaging device 38, as shown in FIG. 6. This window may be coated with a sol-gel material to form an anti-reflective coating 40. The material may be formed in more than one layer, each layer having different optical properties. For example, different layers may be effective for different light wavelengths. Alternatively, reflectivity may be changed by creating graded porosity in the sol-gel. The graded porosity may be achieved by depositing the sol-gel and then etching the sol-gel using known techniques.

Alternatively, an optically clear, stable positive photoresist may be used to form the microlens and photodetector, using low temperature processing conventionally used with photoresists in semiconductor manufacturing processes. For example, MFR-324 made by JSR Microelectronics, Inc., Sunnyvale, Calif., may be used to form the microlens.

While the present invention has been described with respect to a limited number of embodiments, those skilled the art will appreciate numerous modifications and variations therefrom. It is intended that the appended claims cover all such modifications and variations which fall within the true spirit and scope of the present invention.

What is claimed is:

1. A method comprising:
   forming a first photodefinable layer;
   forming a second photodefinable layer over said first photodefinable layer;
   defining said second photodefinable layer so that the first photodefinable layer extends beyond the second photodefinable layer, creating a stepped structure; and
   enabling said stepped structure to act as a diffractive microlens.

2. The method of claim 1 including forming said first and second photodefinable layers of a sol-gel.

3. The method of claim 1 including aligning a photodetector below said microlens.

4. The method of claim 1 including forming said first and second photodefinable layers of a photoresist.

5. The method of claim 4 including forming said first and second photodefinable layers of a positive photoresist.

6. The method of claim 1 including forming said photodefinable layers by incorporating a photoinitiator in said photodefinable layers.

7. The method of claim 1 including depositing said first photodefinable layer on a color filter material.

8. A structure comprising:
   a first photodefinable layer having a first length;
   a second photodefinable layer positioned over said first photodefinable layer and having a second length, said second length being shorter than said first length; and
   said first and second photodefinable layers to create a diffractive microlens.

9. The structure of claim 8 wherein said first and second photodefinable layers are formed of sol-gel.

10. The structure of claim 8 wherein said first and second photodefinable layers are formed of photoresist.

11. The structure of claim 8 including a photodetector arranged underneath said layers.

12. The structure of claim 8 including a color filter arranged beneath said layers.

13. A diffractive microlens comprising:
    a distinct first layer having a first length; and
    a distinct second layer positioned over said first distinct layer having a second length, said second length being shorter than said first length, said first and second layers forming a diffractive microlens.

14. The microlens of claim 13 wherein said layers are formed of sol-gel.

15. The microlens of claim 13 wherein said layers are formed of photoresist.

16. The microlens of claim 13 wherein said first and second layers are photodefinable.

* * * * *